United States Patent [19]
Kim et al.

[11] Patent Number: 5,818,770
[45] Date of Patent: Oct. 6, 1998

[54] CIRCUIT AND METHOD FOR WRITE RECOVERY CONTROL

[75] Inventors: Jae-Chul Kim; Choong-Keun Kwak, both of Seoul, Rep. of Korea

[73] Assignee: Samsung Electronics Co., Ltd., Suwon, Rep. of Korea

[21] Appl. No.: 979,302

[22] Filed: Nov. 26, 1997

Related U.S. Application Data

[63] Continuation of Ser. No. 623,769, Mar. 29, 1996, abandoned.

[30] Foreign Application Priority Data

Mar. 31, 1995 [KR] Rep. of Korea .................. 1995-7524

[51] Int. Cl.⁶ ..................................................... G11C 7/00
[52] U.S. Cl. ..................... 365/194; 365/190; 365/189.01
[58] Field of Search .................................... 365/194, 190, 365/230.06, 189.01

[56] References Cited

U.S. PATENT DOCUMENTS 4,905,192  2/1990  Nogami et al. ......................... 365/194
5,357,479  10/1994  Matsui ..................................... 365/194
5,515,326  5/1996  Hirose et al. ............................ 365/194

Primary Examiner—Vu A. Le
Attorney, Agent, or Firm—Jones & Volentine L.L.P.

[57] ABSTRACT

The present invention relates to a circuit and method for write recovery control for suppressing malfunctions during a write recovery operation. The circuit is for use in a semiconductor memory device including a plurality of memory cells connected in a matrix form to a plurality of word lines and paired bit lines. The circuit comprises a variable load circuit connected to the bit lines, for controlling the voltage level of the bit lines in response to a write enable signal, a word line selector for selecting a predetermined word line in response to an input address, and a delay controller for providing a delay control signal to the word line selector so as to delay activation of the word line selector during the write recovery operation.

4 Claims, 4 Drawing Sheets

CIRCUIT AND METHOD FOR WRITE RECOVERY CONTROL

This application is a continuation of application Ser. No. 08/623,769 filed Mar. 29, 1996, now abandoned.

BACKGROUND OF THE INVENTION

The present invention relates to semiconductor memories. More particularly the present invention relates to a circuit and method for write recovery control for preventing malfunctions during a write recovery operation. The present invention for a circuit and method for write recovery control, is based on Korean Patent Application No. 7524/1995 which is incorporated herein by reference for all purposes.

The recent increase of integration density and capacity of semiconductor memories has reduced the required operating power supply voltage of these memories. This has the further effect of reducing the voltage margin which internal circuits in the semiconductor memory are able to perceive, and thereby increasing the number of malfunctions that may occur. Current semiconductor memories, such as fast SRAMs that require high speed operation, are particularly susceptible to these malfunctions resulting from the reduced voltage margin. Much research has been done regarding components and circuits that might realize stable semiconductor memory devices capable of preventing these malfunctions.

Malfunctions resulting from the reduced voltage margin can be especially prevalent in an access operation of a semiconductor memory. In particular, these kind of malfunctions can increase when first data of a first logic level, e.g., logic "low," is written, into a memory cell, and then second data of a second logic level, e.g., logic "high," is next read from another memory cell. This happens because some time is required to raise the voltage at a bit line BL from a "low" data level during the write operation to a "high" data level during the read operation. If the read operation is performed prior to the lapse of this required time, a malfunction may occur. This means that a malfunction is more likely to occur if any word line is selected before sufficient time is allowed for the precharging of a pair of bit lines.

Thus, in order to reduce the malfunctions occurring during the write operation, the activation of the word line after the address is input should be delayed. The transition time between the write and read operations is called a write recovery. Unfortunately, the use of a sufficient transition time may itself deteriorate the high speed operation of the semiconductor memories.

FIG. 1 is a block diagram showing a chip configuration for write recovery operation circuit, and FIG. 2 is an operational timing diagram of FIG. 1.

In FIG. 1, a plurality of memory cells 18, 20, 22 are connected between a plurality of word lines $WL_1$, $WL_2$, $WL_3$ and a pair of bit lines BL and $\overline{BL}$. The memory cells 18, 20, 22 are preferably memory cells in a static RAM and the configuration of such cells is well-known in the art. The first bit line BL is connected to P-channel transistors 4 and 8, which in turn have their sources connected in common to a power supply voltage $V_{cc}$ and their gates connected to a write enable buffer 2 and a ground potential $V_{ss}$, respectively. The second bit line $\overline{BL}$ is connected to P-channel transistors 6 and 10, which in turn have their sources connected in common to the power supply voltage $V_{cc}$ and their gates connected to the write enable buffer 2 and ground potential $V_{ss}$, respectively.

Using this configuration, the transistors 8 and 10 which have their gates connected to the ground potential $V_{ss}$ are always conductive. In this way, the transistors 8 and 10 limit the voltage level of the "low" data during the write operation by precharging the bit lines to a predetermined voltage level, which serves to rapidly raise the voltage at the bit line of logic "low" level during the write recovery operation. The transistors 4 and 6 receive as gate inputs the output of the write enable buffer 2 and so are not conductive during the write operation but are conductive only during the read operation. The operation of the transistors 4 and 6 thus improves the write recovery characteristic and enables a high speed operation by reducing the charge swing between the bit lines and memory cells during the sequential read operations.

In operation, the write enable buffer 2 receives a write enable signal $\overline{WE}$, and the address buffer 12 receives an address. The output of the address buffer 12 is decoded through a predecoder 14 and a conventional decoder 16, and the result is used to select a designated word line. The configurations and operations of the write enable buffer 2, address buffer 12, predecoder 14, and conventional decoder 16 are well-known in the art.

FIG. 2 shows a timing diagram for the process of writing to a memory cell $MC_1$, and of sequentially reading from memory cells $MC_2$ 20 and $MC_3$ 22. Specifically, FIG. 2 shows the timing for writing to a first memory cell $MC_1$ 18 and then reading from the memory cell $MC_2$ 20, during the write recovery. As shown in FIG. 2, the time required for activating a designated word line $WL_2$ after the input of an address designating the memory cell $MC_2$ 20 is $(T_2-T_1)$. That is, after an address input, a predetermined word line is activated at time $T_2$. In this case, the bit line BL should be changed from a logic "low" level to a predetermined precharge voltage level. In case of writing the "high" data, a pair of bit lines BL and $\overline{BL}$ are in a power supply voltage $V_{cc}$ level and ground voltage $V_{ss}$ level, respectively. On the contrary, the voltage difference between a pair of bit lines during the read operation is remarkably reduced as compared with that during the write operation. The voltage difference between a pair of bit lines is only tens of millivolts. In a circuit configuration like FIG. 1, if the word line is activated before the bit line BL is sufficiently recovered to the logic "high" level during the write recovery, this may cause malfunctions of the circuit. In order to prevent such malfunctions, the following word line should be activated after the bit line BL is sufficiently charged to the logic "high" level. However, in case of delaying the activation of the word line in consideration of the time required in sufficiently charging the bit line BL, the overall access operations may become slow.

SUMMARY OF THE INVENTION

It is therefore an object of the present invention to provide a semiconductor memory device capable of performing high speed operation through an efficient access.

It is another object of the present invention to provide a stable semiconductor memory device free from malfunctions.

It is still another object of the present invention to provide an access method for delaying the word line enable time during a write recovery operation and shortening the word line enable time during another mode operation, thus enabling high speed operation of the memory.

To achieve the above objects of the present invention, there is provided a write recovery control circuit for use in a semiconductor memory device having a plurality of memory cells connected in a matrix form to a plurality of word lines and a pair of bit lines, the write recovery control circuit comprising: a variable load circuit, connected to the pair of bit lines, for controlling the voltage level of the pair of bit lines in response to a write enable signal; a word line selection circuit for selecting a predetermined word line in response to an input address; and a delay control circuit for providing a delay control signal to the word line selection circuit so as to delay activation of the word line selection circuit during a write recovery operation.

To achieve the above object, there is also provided a write recovery method of a semiconductor memory device having a plurality of memory cells connected in a matrix form to a plurality of word lines and a pair of bit lines, the method comprising the steps of generating a delay control signal in response to a write enable signal; sufficiently precharging the pair of bit lines in response to the write enable signal; delaying activation of a predetermined word line for a predetermined time in response to the delay control signal; and activating the predetermined word line after the predetermined time.

BRIEF DESCRIPTION OF THE INVENTION

These and various other features and advantages of the present invention will be readily understood with reference to the following detailed description taken in conjunction with the accompanying drawings, in which.

DETAILED DESCRIPTION OF THE PREFERRED EMBODIMENT

Figure 1:
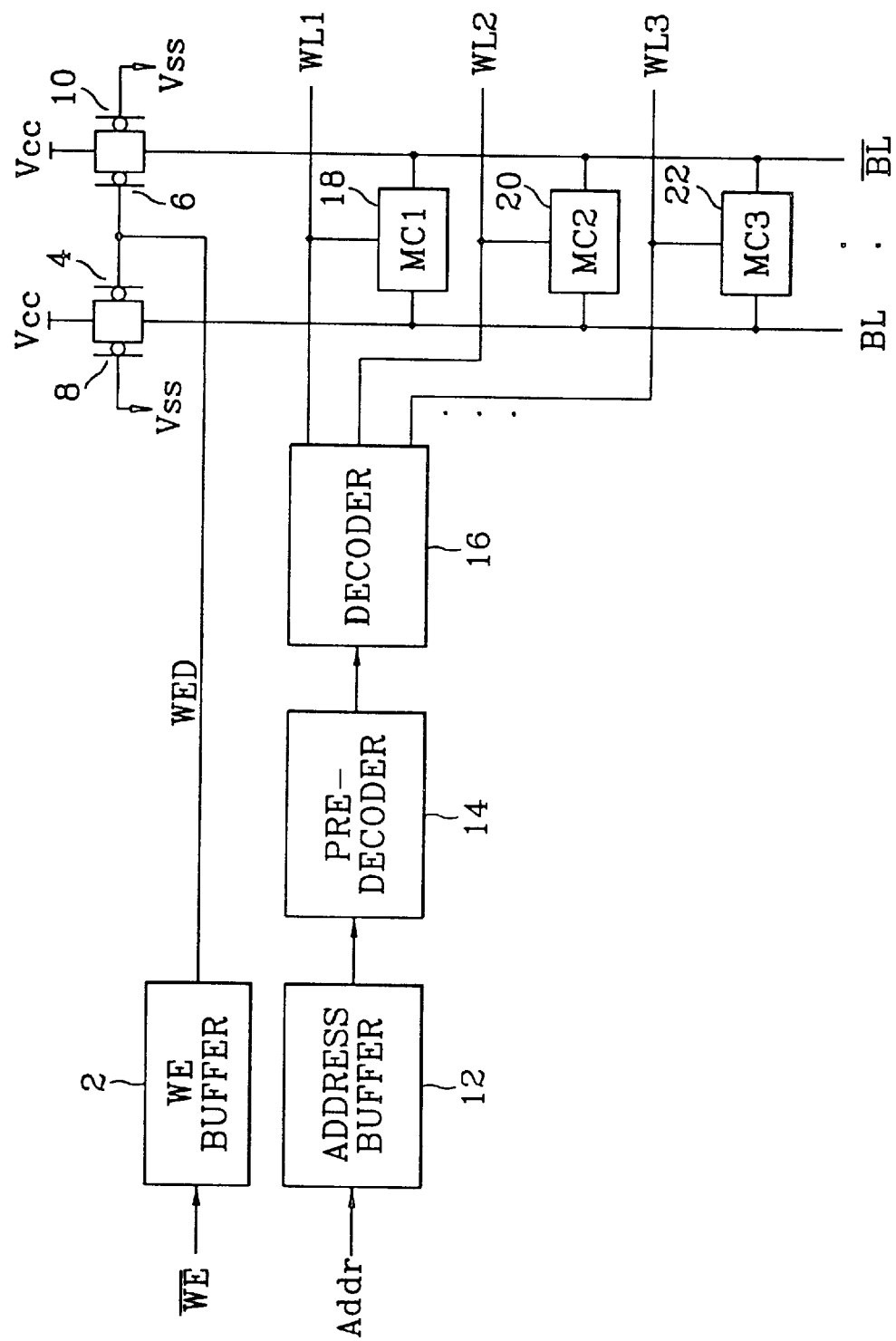
FIG. 1 is a block diagram showing a chip configuration for write recovery operation according to a conventional write recovery circuit.

The parts having common functions are designated with the same reference numerals throughout all the figures.

Figure 3:
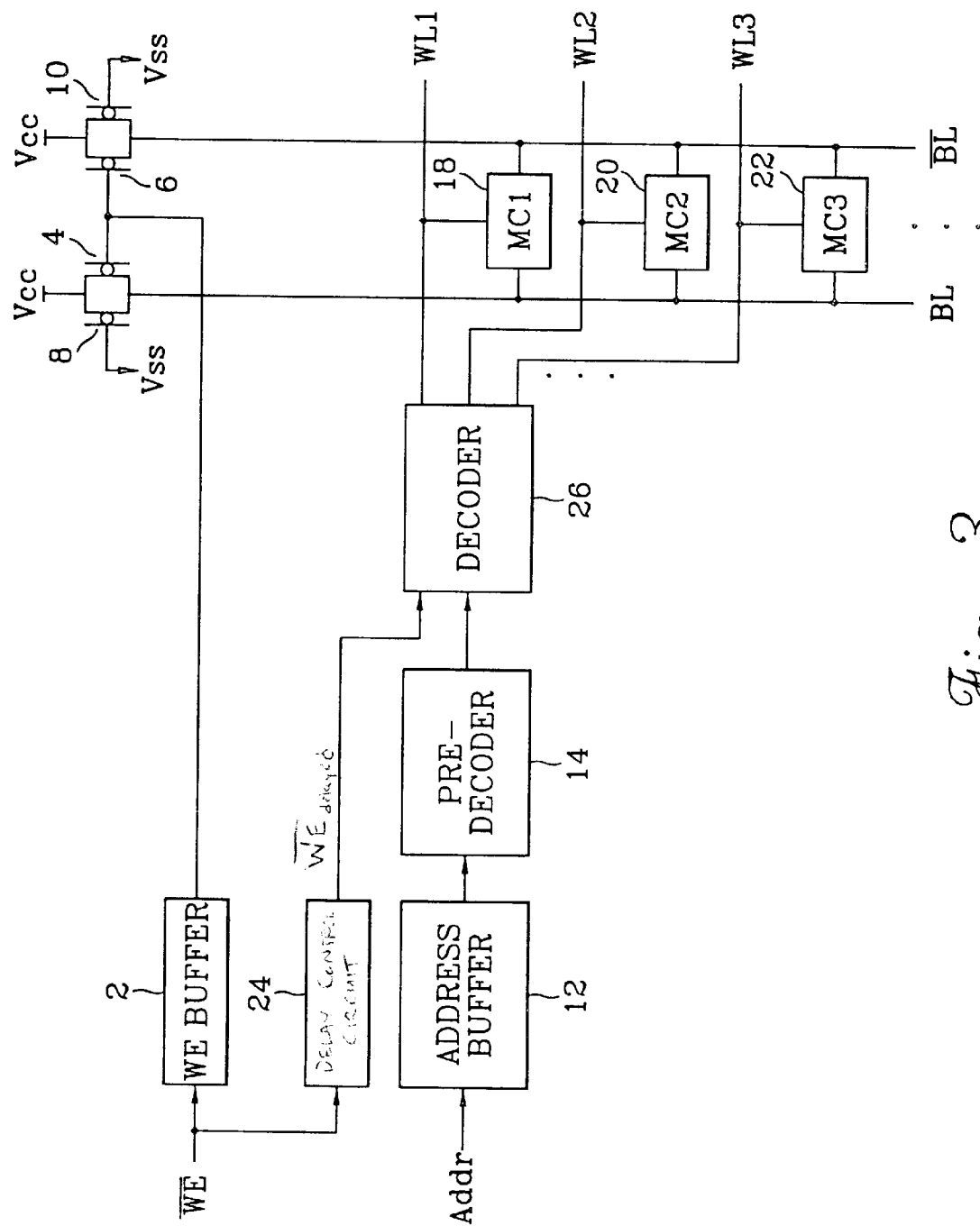
FIG. 3 is a block diagram showing a chip configuration for write recovery operation according to a preferred embodiment of the present invention.
Figure 4:
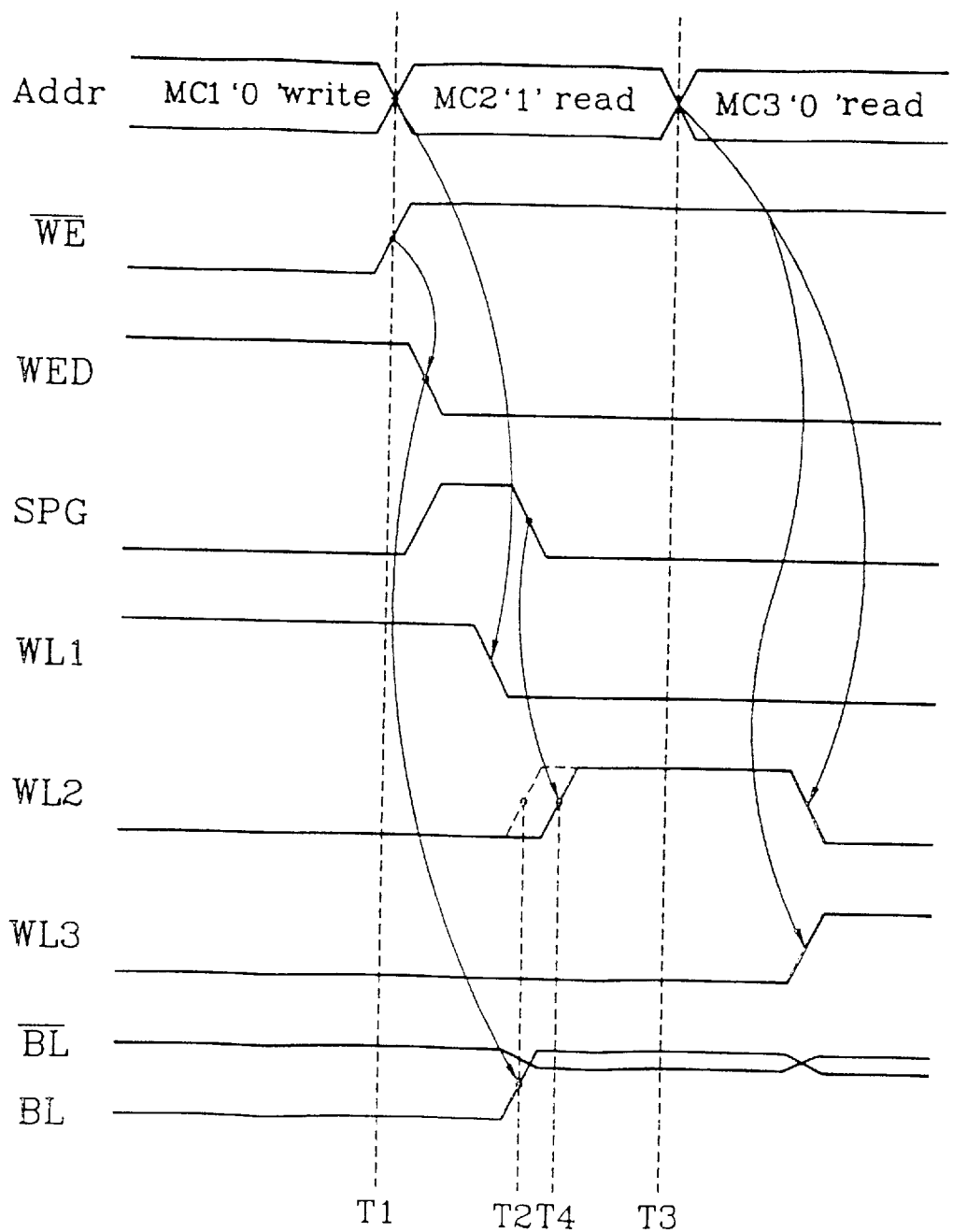
FIG. 4 is an operational timing diagram of the circuit shown in FIG. 3.

FIG. 3 is a block diagram showing a chip configuration for a write recovery operation according to a preferred embodiment of the present invention, and FIG. 4 is an operational timing diagram of the circuit shown in FIG. 3. The write recovery circuit of FIG. 3 has the same construction similar to that of FIG. 1 except for the addition of a delay control circuit 24. In the preferred embodiment, the delay control circuit is a pulse generator for generating a monostable pulse.

The pulse generator 24 generates a delay control signal $\overline{WE}_{delayed}$ in response to a write enable signal $\overline{WE}$, and applies the delay control signal $\overline{WE}_{delayed}$ to a decoder 26. While the decoder 16 of FIG. 1 directly decodes the output of the predecoder 14, the decoder 26 in the preferred embodiment of the present invention decodes the output of the predecoder 14 only when it receives the delay control signal $\overline{WE}_{delayed}$ from the pulse generator 24. The decoder 26 only decodes the output of the predecoder 14 when it is activated by the delay control signal $\overline{WE}_{delayed}$ of the pulse generator 24. Except for the fact that the decoder 26 receives and is partially controlled by the output of the pulse generator 24, the decoder 26 operates similarly to the conventional decoder 16 shown in FIG. 1.

Figure 2:
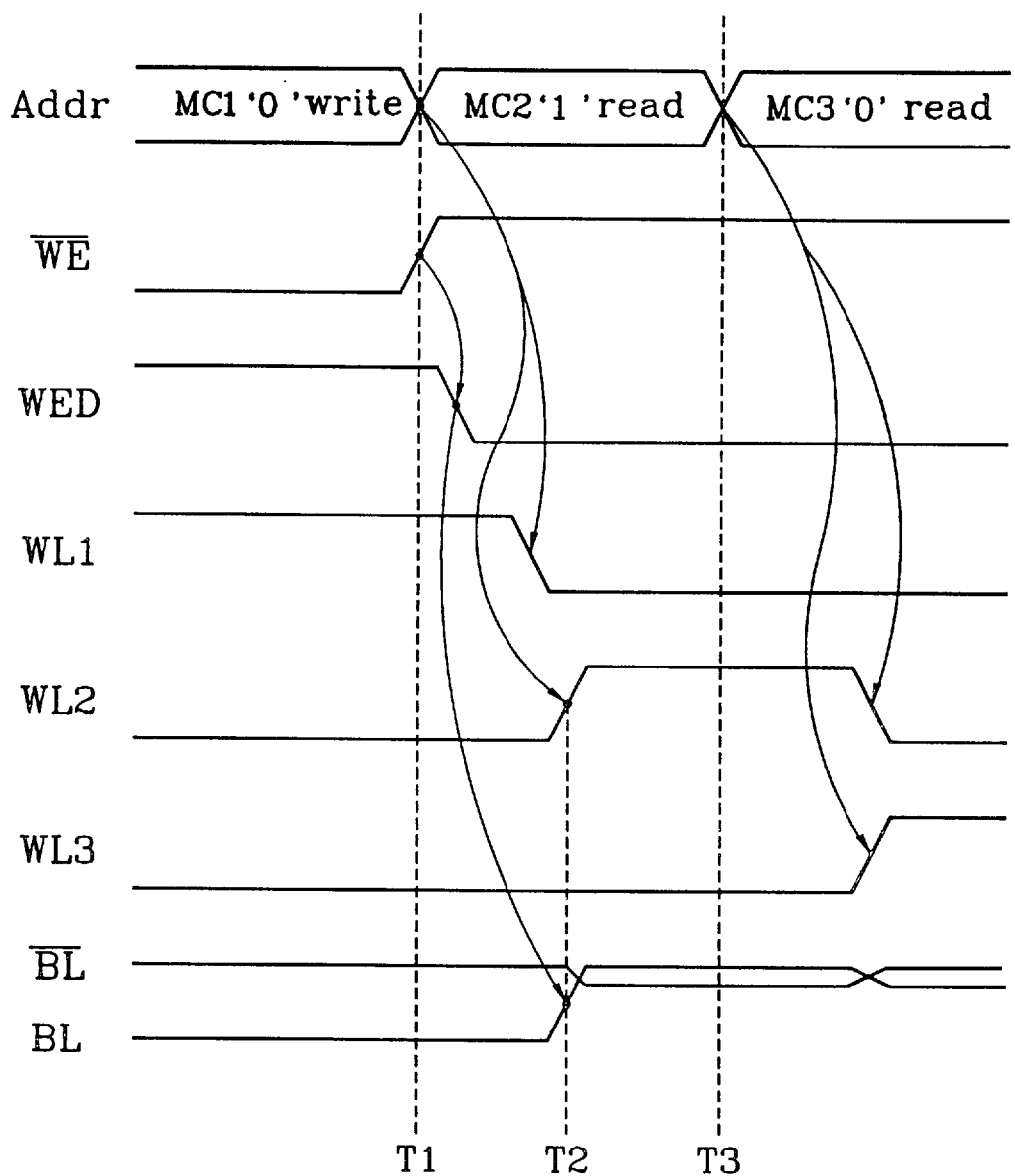
FIG. 2 is an operational timing diagram of the circuit shown in FIG. 1.

Referring to FIG. 4, a designated word line is activated during the write recovery after being delayed for a predetermined time by the delay control signal $\overline{WE}_{delayed}$. Using the circuit shown in FIG. 3, the word line $WL_2$ is delayed by the delay control signal $\overline{WE}_{delayed}$ for the time $(T_4-T_2)$ and then is activated at time $T_4$. The read operation is thus performed after the bit line BL, which has performed the write operation, has moved from a logic "low" level to a logic "high" level. Accordingly, during the write recovery operation, the time required to activate the word line is delayed by the delay control signal $\overline{WE}_{delayed}$. This serves to shorten the time required to activate the word line during various modes operation. The remaining operations of the circuit are the same as for the circuit shown in FIG. 2.

By delaying the time required to enable the word line during the write recovery operation as described above, the read operation is performed after the bit line is sufficiently raised to a high voltage level. This can significantly reduce the number of malfunctions occurring during write recovery, thus allowing for stable semiconductor memory devices. In addition, this circuit and method also allows the overall access operations to be performed at high speeds. These higher speeds result from shortening the time required to activate the word line after the address input is provided and delaying the activation of the designated word line only during the write recovery operation. This makes it possible to realize a stable semiconductor memory capable of operating in a high speed.

While there has been illustrated and described what is considered to be preferred embodiment of the present invention, it will be understood by those skilled in the art that various changes and modifications may be made without departing from the scope of the present invention. Therefore, it is intended that the present invention not be limited to the particular embodiment disclosed as the best mode contemplated for carrying out the present invention, but that the present invention includes all embodiments falling within the scope of the appended claims.

What is claimed:

1. A write recovery control circuit for use in a semiconductor memory device having a plurality of memory cells connected in a matrix form to a plurality of word lines and a pair of bit lines, the write recovery control circuit comprising:

a variable load circuit, connected to the pair of bit lines, for controlling the voltage level of the pair of bit lines in response to a write enable signal;

a word line selection circuit for selecting a predetermined word line in response to an input address; and a delay control circuit for providing a monostable pulse delay control signal to the word line selection circuit so as to delay activation of the word line selection circuit during a write recovery operation, the monostable pulse being shorter in duration than the write enable signal.

2. The write recovery control circuit as claimed in claim 1, wherein the delay control circuit is connected to a decoder associated with row selection so as to control operation of the decoder.

3. A write recovery method of a semiconductor memory device having a plurality of memory cells connected in a matrix form to a plurality of word lines and a pair of bit lines, the method comprising the steps of:

generating a monostable pulse delay control signal in response to a write enable signal, the monostable pulse being shorter in duration than the write enable signal;

sufficiently precharging the pair of bit lines in response to the write enable signal;

delaying activation of a predetermined word line for a predetermined time in response to the delay control signal; and activating the predetermined word line after the predetermined time.

4. The write recovery method as claimed in claim 3, wherein the predetermined time is the time required to activate the voltage of the pair of bit lines during a write recovery operation.

* * * * *